United States Patent
Merlet

(10) Patent No.: US 7,027,301 B2
(45) Date of Patent: Apr. 11, 2006

(54) SYSTEM AND APPARATUS FOR HEAT DISSIPATION IN AN ELECTRONIC DEVICE

(75) Inventor: Herve Merlet, Sevon sur Vilaine (FR)

(73) Assignee: Canon Europa NV, Amstelveen (NL)

( * ) Notice: Subject to any disclaimer, the term of this patent is extended or adjusted under 35 U.S.C. 154(b) by 0 days.

(21) Appl. No.: 11/058,089

(22) Filed: Feb. 14, 2005

(65) Prior Publication Data

US 2005/0174736 A1  Aug. 11, 2005

Related U.S. Application Data

(63) Continuation of application No. 10/840,405, filed on May 7, 2004, now abandoned.

(30) Foreign Application Priority Data

May 26, 2003 (FR) .................................. 03 06382

(51) Int. Cl.
*H05K 7/20* (2006.01)
(52) U.S. Cl. .................. 361/695; 361/690; 165/104.34
(58) Field of Classification Search ................ 361/676, 361/678, 687, 690, 692, 694, 695; 454/184–186; 165/80.3, 80.4, 104.34; 312/223.1, 223.2, 312/223.3; 174/15.1, 16.1
See application file for complete search history.

(56) References Cited

U.S. PATENT DOCUMENTS

| 3,735,020 | A | | 5/1973 | Licata | 174/66 |
| 5,898,569 | A | * | 4/1999 | Bhatia | 361/700 |
| 6,172,871 | B1 | * | 1/2001 | Holung et al. | 361/687 |
| 6,307,746 | B1 | * | 10/2001 | Beckman | 361/687 |
| 6,855,881 | B1 | * | 2/2005 | Khoshnood | 174/15.1 |

FOREIGN PATENT DOCUMENTS

| DE | 38 28 627 | | 2/1990 |
| JP | 01-264513 | | 10/1989 |
| JP | 03242996 | A * | 10/1991 |

* cited by examiner

*Primary Examiner*—Anatoly Vortman
(74) *Attorney, Agent, or Firm*—Fitzpatrick, Cella, Harper & Scinto

(57) ABSTRACT

A system for the dissipation of heat in at least one electronic device in a home network comprises at least one electronic device connected to a central unit (100) by a link (60a, 60b, 60c, 60d) comprising means (40a, 40b, 40c, 40d) able to transport data. This system is such that the heat dissipation is obtained by circulation of air through the link connecting the electronic device to the central unit. More particularly, the system and apparatus of the invention are situated in a home communications network comprising multimedia connection interfaces and an interconnection module.

17 Claims, 6 Drawing Sheets

SYSTEM AND APPARATUS FOR HEAT DISSIPATION IN AN ELECTRONIC DEVICE

This application is a continuation of application Ser. No. 10/840,405, filed May 7, 2004 now abandoned.

BACKGROUND OF THE INVENTION

1. Field of the Invention

The present invention relates to a system and apparatus for the dissipation of heat in an electronic device, especially a connection interface, in a home network. The invention can be applied especially to a communications network.

There is a growing trend towards the development of home networks. A large number of electronic instruments are grouped together to form a network and thus enable centralized management of the instruments and devices or again enable communications between the devices. Electronic devices such as electric switches, dimmer switches or, again, connection interfaces are used in home networks. These electronic devices are increasingly sophisticated and sometimes fulfill numerous functions in integrating electronic components. These components may be, for example, interior sensors or proximity sensors in switches or again encoders/decoders in connection interfaces. In most cases, the electronic devices are connected to a central apparatus to form the home network. This central apparatus, which shall be called a central unit, is generally located away from the main habitable rooms, for example in the garage.

Ducts to take interconnection cables between the central unit and the electronic devices described above are provided for in the house.

These electronic devices, which carry out a large number of functions, need considerable electrical power. Moreover, since they are generally inserted into the partition walls of a dwelling, they release heat when performing their functions. This is because of the electrical power used.

Heat dissipation must therefore be planned for these electronic devices in order to ensure their efficient operation.

2. Description of the Prior Art

The document U.S. Pat. No. 3,735,020 presents an electronic switch/dimmer that is cooled by a metal front face.

In addition to not having an aesthetic appearance, this system has limited cooling capacity.

The prior art also provides for fans that are integrated into the electronic packages and act directly on the components to be cooled. However, this increases the cost of the package. Moreover, the fan is noisy during operation. This is especially inconvenient when the electronic device is located in the habitable rooms of a house.

In addition, there are centralized ventilation systems for home use, commonly known as CMV (Controlled Mechanical Ventilation) systems. These systems are designed to renew stagnant air and prevent unpleasant odors from settling. The ducts used for this kind of application are generally wide-diameter ducts (the smallest have a diameter of 80 mm). The basic principle of these CMVs is that they get rid of the stagnant air outwards through vents linked by a network of ducts to a fan. This extraction creates a depression in the house favoring the entry of cool air through natural inlets (self-adjustable grills) positioned in the main rooms.

There are more sophisticated dual-flow systems that work with two fans. Such a system enables a calorie-exchange unit to be interposed between the two air flows to recover the losses due to the renewal of air.

The CMV systems can in no way be used to dissipate the heat of electronic devices in the dwelling. As for the dual-flow systems described above, they tend to bring heat into the dwelling.

SUMMARY OF THE INVENTION

The invention seeks to resolve the problem of heat dissipation in the electronic devices inserted into the partition walls of a dwelling and connected to a central unit of a home network, in a simple and low-cost way that prevents noise disturbance in the rooms, especially the habitable rooms or office rooms, while at the same time maintaining the aesthetic appearance of the electronic devices.

It is also an object of the invention to resolve the problem of the accumulation of dust in such an electronic device. This accumulation of dust causes damage to this device.

To this end, the invention proposes a system for the dissipation of heat in at least one electronic device in a home network comprising at least one electronic device connected to a central unit by a link comprising means able to transport data. This system is such that the heat dissipation is obtained by circulation of air through the link connecting the electronic device to the central unit.

Thus, centralized dissipation is possible for several electronic devices of a same network. Furthermore, the infrastructure already present in a home network of this kind is re-utilized. This removes the need for installing another specific infrastructure.

In a preferred embodiment of the invention, a link comprises a hollow duct in which there passes at least one data-transport cable.

Ducts of this kind are indeed designed when constructing a dwelling.

According to a particular characteristic, the hollow duct has a diameter of less than 30 mm.

According to a preferred embodiment, the central unit comprises a fan adapted to the creation of an air depression inside it.

Thus, the fan will ensure that the air is drawn out to in order to be discharged from the central unit. This air depression will enable a preferred mode of functioning of the heat dissipation system.

Preferably, the depression inside the central unit is such that the pressure inside it is lower than the pressure inside the room in which the electronic device is located.

According to one embodiment of the invention, the electronic device is closed and comprises an air inlet.

This enables cool air to enter the electronic device in order to cool the components that it contains.

In a preferred embodiment, the central unit is closed and also comprises an air inlet.

Thus, cool air can also penetrate the central unit in order to cool the components that it contains.

Advantageously, the central unit is located in a room of the home network different from that in which the electronic devices are located.

In a particular embodiment, the electronic devices are connection interfaces adapted to the connection of different multimedia devices.

These devices are often installed in home communications networks. Similarly, in networks of this kind, the central unit includes an interconnection module adapted to manage the data exchanges between the connection interfaces.

The heat dissipation system is then particularly well suited to a communications network of this kind.

According to one variant of implementation, the electronic devices possess a temperature sensor and the dissipation of the heat in the electronic devices is controlled as a function of the information on temperature coming from the temperature sensors.

Thus, the regulation of the heat dissipation system is more precise and adapted to the real power consumption of the electronic devices.

Correlatively, the object of the invention is a heat dissipation apparatus designed to dissipate the heat of at least one electronic device in a home network comprising at least one electronic device connected to the apparatus by a link comprising means able to transport data. This apparatus comprises ventilation and air discharge means capable of creating an air depression in the apparatus and discharging the air coming from the link connecting the electronic device.

The heat dissipation apparatus comprises means necessary for the working of the heat dissipation system according to the invention. It thus has the same advantages as those referred to here above for the heat dissipation system.

BRIEF DESCRIPTION OF THE DRAWINGS

Other features and advantages of the invention shall appear in the following description made with reference to the appended drawings, which are given by way of non-exhaustive examples. Of these figures.

MORE DETAILED DESCRIPTION

Figure 1:
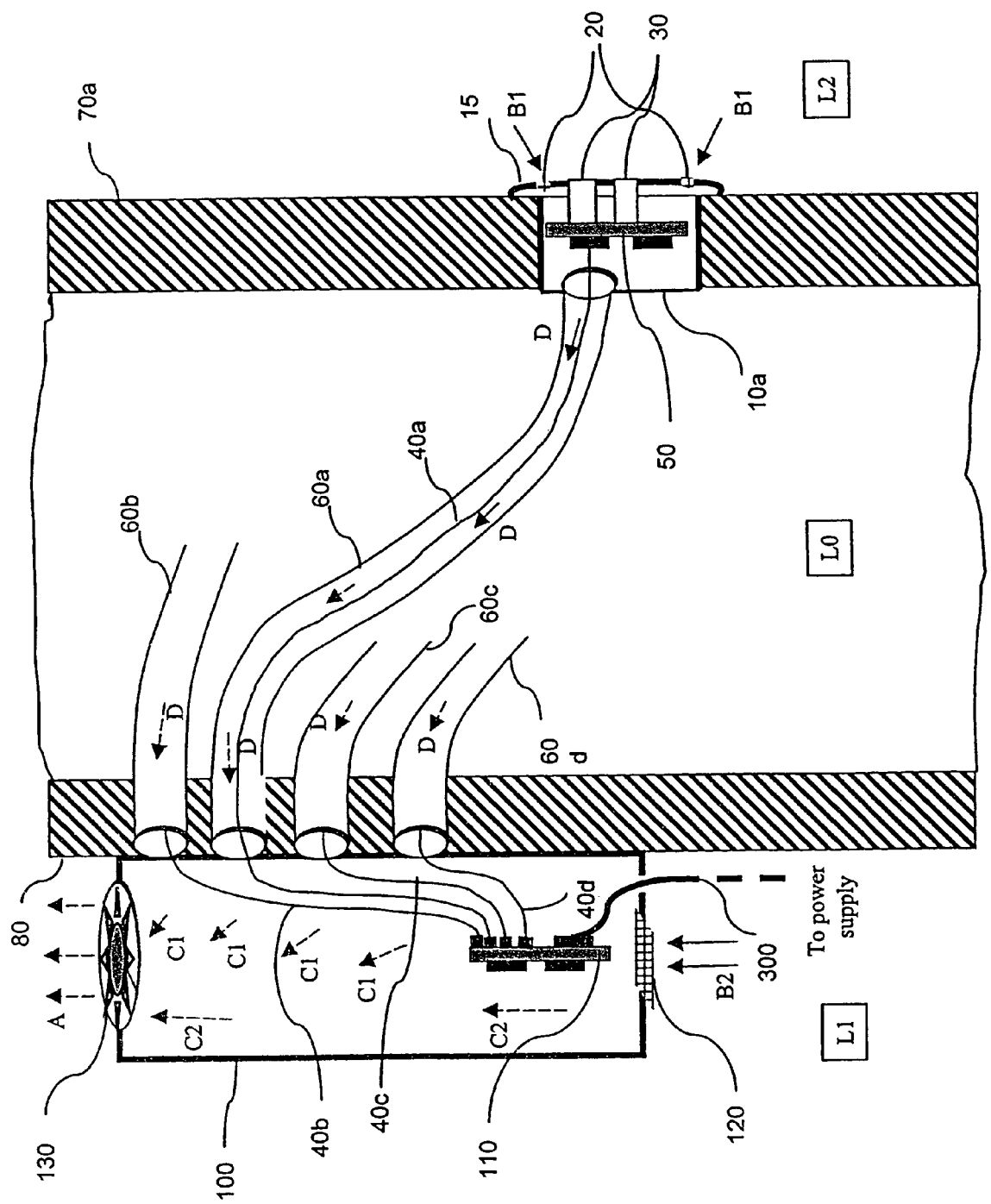
FIG. 1 is a schematic view of the heat dissipation system in a home network according to the invention.

Referring to FIG. 1, we shall first of all describe the heat dissipation system according to the invention. FIG. 1 shows different elements of a home network such as, for example, a home automation network or again a communications network. This network comprises electronic devices such as, for example, light switches, mains supply connectors or connection interfaces. Only one of these devices is shown in FIG. 1. It is represented schematically by a package 10a comprising an electronic board 50, a front face 15 in which airing holes 20 are made. This package is embedded in a wall or partition 70a of a habitable room L2 and is connected to a central unit 100 by means of a duct 60a. This electronic device shall be described in greater detail with reference to FIG. 2.

The centralized unit 100 is, for example, located in an annex room of the dwelling such as the garage or a machinery room L1. It is located, for example, beside the electric cabinet of the house. This unit is connected to several electronic devices, similar to the one described in FIG. 2, by means of links 60a, 60b, 60c and 60d.

These links are electrical ducts designed to make the electric cables pass through the different parts of the house such as the walls, the floors or the ceilings L0. These ducts are generally designed to protect the cables from the environment during and after the construction of the house and also to facilitate the insertion of other cables, if any, through the dwelling. These ducts generally have a diameter of about 20 mm. More generally, they have a diameter of less than 30 mm, i.e. they have a small diameter as compared with that of ducts specially designed for CMV systems.

The central unit 100 comprises a fan 130 responsible for discharging the air outwards from it, an air inlet 120, an electronic board 110 responsible for managing the home network and connections to the ducts coming from the different habitable rooms. The central unit also comprises a power supply cable 300 which is connected, for example, to the mains power system of the dwelling.

Inside the ducts, cables 40a, 40b, 40c and 40d transporting data are connected to the electronic board 110 so that central control can be carried out in the home network thus described.

The system of heat dissipation works as follows:

To discharge the hot air coming from the electronic components of the device 10a, a depression is created by the fan 130 in the central ventilation unit 100 and therefore at the place of arrival of the ducts 60a, b, c and d. The depression will prompt a suction of air coming from the ducts towards the fan (as indicated by the arrows C1). The air inlet 20 in the electronic device 10a will enable the air coming from the habitable rooms (represented by arrows B1) to flow around the components which give out heat from the device and therefore cool it down. The air is drawn into the duct 60a (as indicated by the arrows D) and is discharged by the fan 130 outwards (shown by the arrows A). This air inlet can take the form of a sufficiently small grill which can thus serve as a dust filter.

Similarly, the central unit has an air inlet 120 which will enable the air (arrows B2) to enter and flow around the components of the board of this central unit in order to cool them before getting drawn towards the fan (as indicated by the arrows C2) and being pushed outwards (arrows A) by the fan 130.

Preferably, if P2 is the pressure in the rooms of a dwelling, this pressure is generally lower than the outside atmospheric pressure P0. This difference in pressure is, for example, due to the CMV type ventilation system in the dwelling. If P1 is the pressure of the annex room in which the central ventilation unit is located, this pressure is lower than the external pressure P0 but higher than the pressure P2 of the habitable rooms.

The fan provided in the ventilation unit is then carefully chosen and adjusted so as to create pressure P3 within the device that is lower than the pressure in the habitable rooms. Thus, the following relationships are obtained: P3<P2<P1<P0. A pressure relationship of this kind between the rooms enables the dissipation system to work optimally.

This system has the advantage of providing for a centralized dissipation of the heat, i.e. it can be used for several electronic devices forming part of the home network. The dissipation of the heat takes place silently in the electronic devices located in the habitable rooms. Furthermore, the system as designed makes the air flow in an appropriate direction so that no dust collects in the electronic devices especially if these devices are equipped with dust filters at their air inlet. Indeed, the system will discharge air and also the dust coming from the electronic devices through the outlet represented by the arrows A, i.e. in the garage or machinery room in which the central unit is located.

Figure 2:
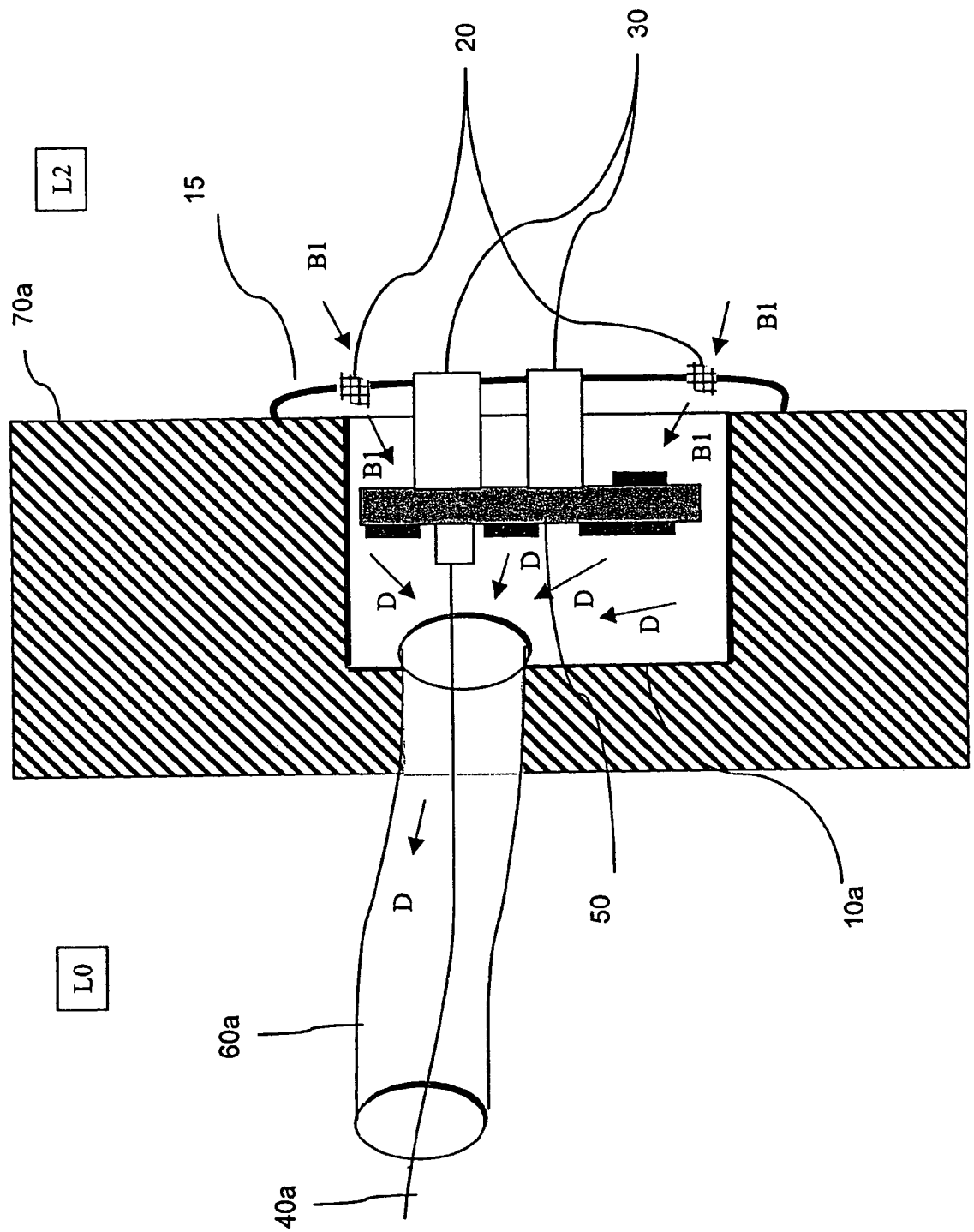
FIG. 2 shows an electronic device of the home network requiring heat dissipation.

Referring to FIG. 2, a closer look shall now be taken at an electronic device 10a of the home network.

This electronic device has a front face 15 comprising interface elements 30 which may, for example, be switch buttons, rotating knobs or again connectors of different types.

These interface elements are connected to an electronic board 50 that has different components. These components are designed, inter alia, to perform specific functions.

The possible functions that such a device can perform are, for example, of the following type: dimmer switch functions, interior or luminosity sensor functions or, again, the functions of coding/encoding and multiplexing/demultiplexing data. In the case of the dimmer switch function, the interface element is a dimmer switch such as a rotating wheel or knob. In the case of the sensor function, the interface element is a sensor and, in the case of the encoding/decoding function, the interface element is a connector.

The front face 15 also has an air inlet 20 shown here in the form of an airing grill. The grill holes may of course be designed so that only air can enter therein and no objects.

The electronic board 50 and the front face are integrated into an enclosed package which is connected to a duct 60a which is itself connected to a central unit that shall be described further below.

The electronic board is powered either through the data-transport cable 40a, and therefore through the power supply coming from the central unit, or through a connection, not shown in FIG. 1, to the power supply mains of the dwelling.

Inside the duct, there is a cable 40a in which there flows data intended for the central unit or coming from this very same unit. This data enables the control, for example, of the electronic board 50 so that it carries out the stipulated functions.

When the heat dissipation system is in operation, the cool air coming from the habitable room enters through the air inlet 20. This cool air is represented by the arrows B1. It passes around the components of the card 50 in order to cool them, is then drawn in through the duct 60a, and reaches the central unit to which it is connected. After having cooled the components of the card 50, the air gets heated and is represented by the arrows D.

The electronic device is closed and is embedded in a partition or wall 70a of a habitable room L2. The link between the duct 60a and the package of the electronic device is made in such a way that it prevents air leaks.

Figure 3:
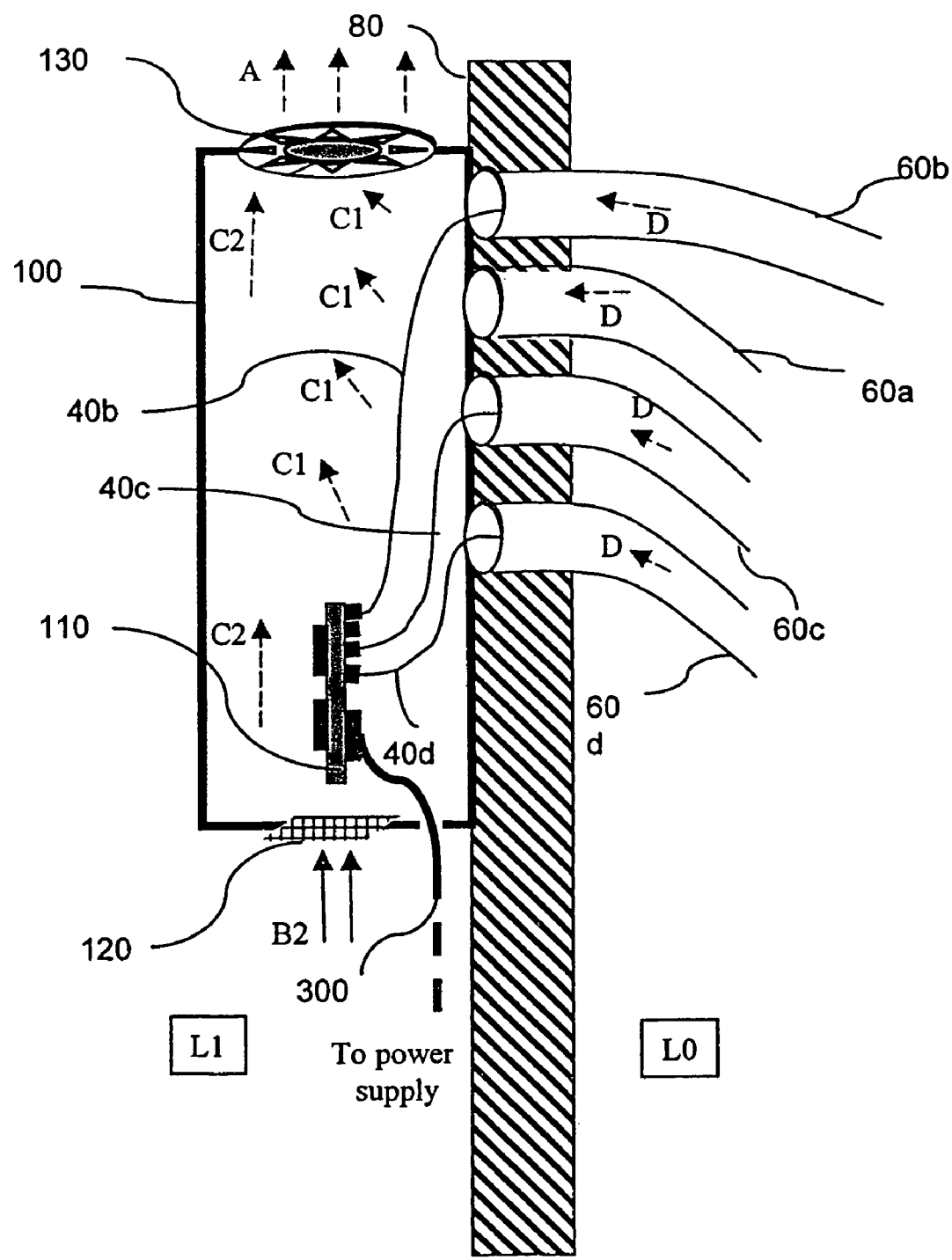
FIG. 3 shows a heat dissipation apparatus designed to dissipate the heat in an electronic device of the network according to the invention.

FIG. 3 shows a central unit comprising a heat dissipation apparatus according to the invention. This central unit 100 comprises, inter alia, an electronic board 110 (or several boards connected together) comprising a controller capable of managing the data flowing in the cables 40a, b, c and d that come from the different electronic devices of the network. This board will enable, for example, the management of the devices of the house in the case of a home automation network. It can also be used to manage the exchanges of data flows in a home communications network. It also serves to manage the motor (not shown in the figure) that makes the fan 130 work.

This central unit has an air inlet 120, a fan 130 and a power cable 300 connected to the mains supply of the dwelling. This power supply enables the operation of the electronic board of the central unit, the motor connected to the fan and, also, in one possible mode of implementation, the electronic devices of the network through the data-transport cables.

The central unit is connected to several ducts 60a, 60b, 60c and 60d. These ducts go through the different habitable rooms to connect the different devices of the network. They include cables 40a, 40b, 40c and 40d carrying the data needed for the card 110. These ducts are connected to the package of the central unit so as to prevent air leaks.

When the fan is put into operation, it creates a depression inside the package. This depression will enable air to be drawn in from the electronic devices through the ducts as described with reference to FIG. 1.

This central unit is advantageously located in an annex room of the dwelling such as a garage or a machinery room. It is fixed to the wall 80 so as to get connected to the electrical ducts laid out in the dwelling. The central unit receives hot air, represented by arrows D, from the ducts. This hot air is drawn in by the fan 130. This movement is represented by the arrows C1. Then the air is sent to the exterior of the unit as represented by the arrows A. Similarly, the dissipation system can also be used to cool the board of the central unit. To this end, an air inlet 120 is provided on the lower face of the unit to let in cool air, represented by the arrows B2. This air passes around the components of the board 110 in order to cool them and rises towards the fan 130. The hot air, after the cooling of the board 110, is represented by the arrows C2. This hot air is then sent out of the unit as represented by the arrows A.

Figure 4:
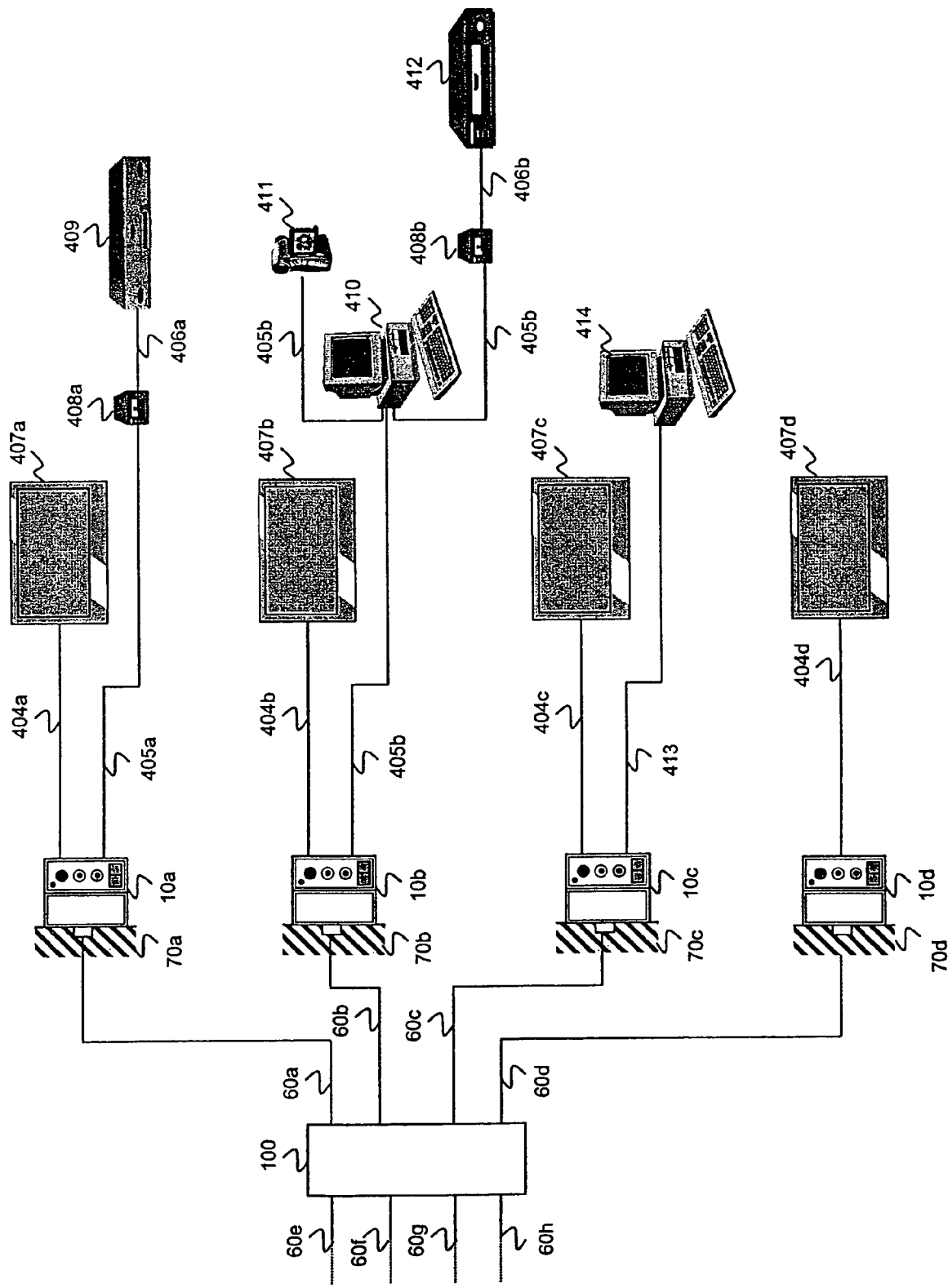
FIG. 4 shows a communications network in which it is possible to apply a dissipation system according to the invention.

FIG. 4 shows a home communications network in which it can advantageously be planned to install the heat dissipation system of the invention.

This multimedia communications network interconnects devices such as television sets referenced 407a, 407b, 407c and 407d, a DVD type reader referenced 409, a video cassette recorder referenced 412, computer type device referenced 410 and 414, as well as a digital camcorder referenced 411.

According to the invention, this network comprises multimedia interface electronic devices referenced 10a, 10b, 10c and 10d. The multimedia connection interfaces referenced 10a, 10b, 10c, 10d are, for example, integrated into the partition walls 70a, 70b, 70c and 70d of the habitable rooms.

These multimedia connection interfaces are connected to a central unit 100 preferably placed beside the electric power supply cabinet through links referenced 60a, 60b, 60c and 60d. The central unit is connected to other connection interfaces (not shown in the figure for the sake of simplicity) by links 60e, 60f, 60g, 60h in such a way that it manages eight connection interfaces. This is, of course, an exemplary embodiment of a communications network of this kind.

These links are electrical ducts usually installed in the dwellings to protect the cables that may be inserted therein. As it happens, the cables inside these ducts are cables, for example, of the UTP5 (Unshielded Twisted Pair, category 5) type as specified in the ANSI/TIA/EIA/568A standard) classically used in Ethernet type networks. It must be noted that other types of cables could be used, for example optical fibers or cables compliant with the IEEE 1355 standard.

The television set 407a is connected by means of an analog video link 404a to the multimedia interface device 10a. According to one variant, the link 404a may be compliant with the IEEE 1394 standard and the television set then has an IEEE 1394 board. Similarly, the television sets 407a, 407c and 407d are respectively connected to the multimedia interface devices 10b, 10c and 10d by means of analog video links 404b, 404c and 404d.

The DVD reader referenced 409 is connected by means of an analog link 406a to an analog-digital converter referenced 408a. This converter is itself connected by an IEEE 1394 compliant digital link 405a to the multimedia interface device 10a. This converter converts the analog video information generated by the DVD reader into an IEEE 1394 compliant format.

The computer 410, the camcorder 411 and the analog-digital converter 408b are connected to one another and to the multimedia interface device 10b by means of a digital link 405b compliant with the IEEE 1394 standard. The analog-digital converter 408b is itself connected to the analog video cassette recorder 412 by means of the link 406b.

The computer referenced 414 is connected by means of an Ethernet type link 413 to the multimedia interface device 10c.

Each of the multimedia connection interfaces comprises at least Ethernet and IEEE 1394 type connection means and an analog video output. This multimedia connection interface shall be described with reference to FIG. 5. All the information obtained by these connection means will be distributed to other remote multimedia connection interfaces through the central switch unit 100 and links connecting this unit to the different connection interfaces. The central switch unit comprises a heat dissipation apparatus according to the invention. It shall be described with reference to FIG. 6.

Advantageously, the multimedia connection interfaces are located in the habitable rooms of a house and the central unit 100 is located in a non-habitable room such as the garage or a machinery room.

Figure 5:
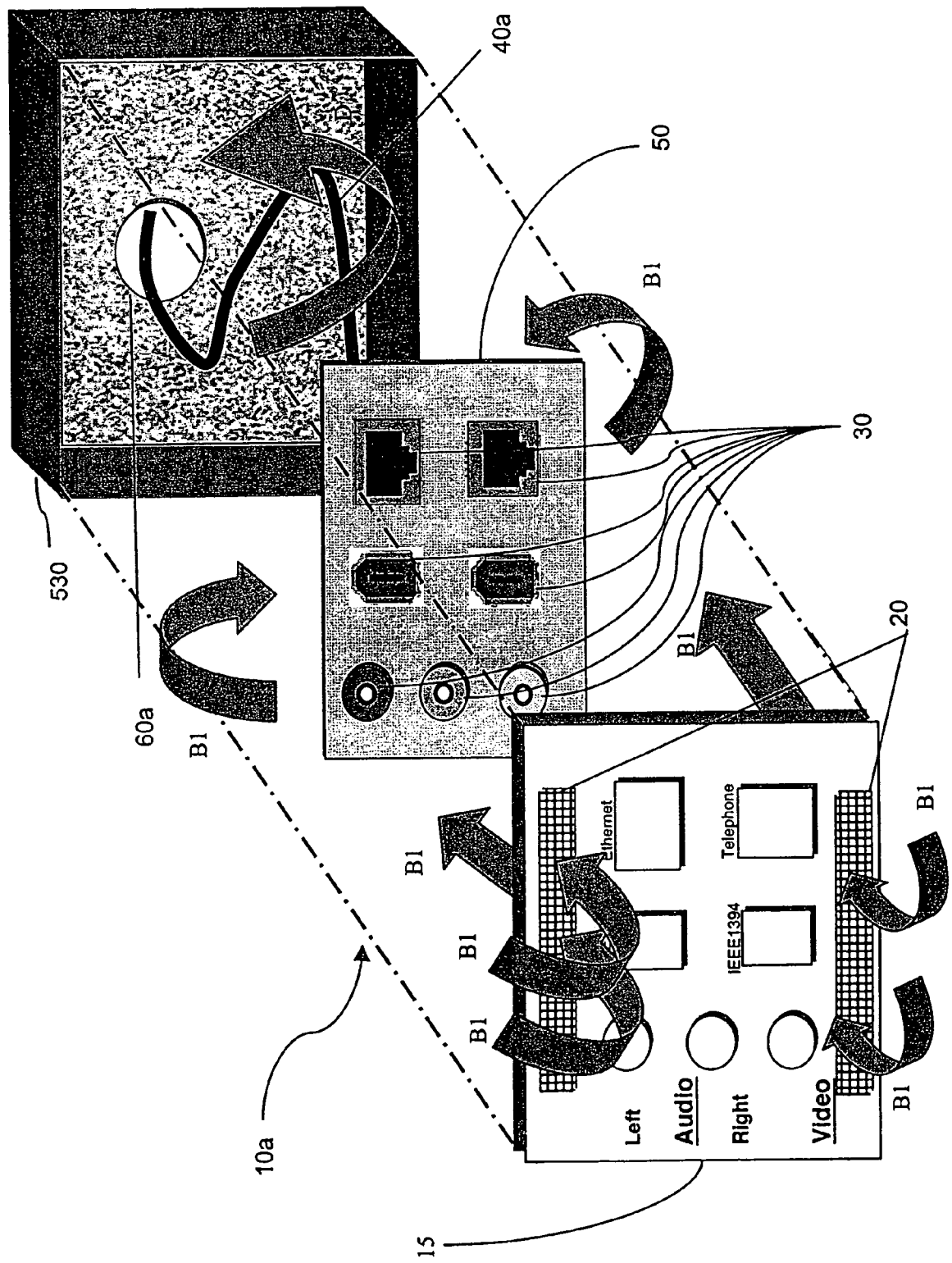
FIG. 5 shows a connection interface type of electronic device in a communications network implementing the heat dissipation system according to the invention.

FIG. 5 is an exploded view of a multimedia connection interface type of electronic device 10a as provided for in a communications network as described in FIG. 4.

This device has a front face 15 on which are set down the possibilities of connecting this interface and in which there are provided the positions reserved for these connections. On the front face, there are also provided airing grills 20 through which the cool air, represented by the arrows B1, will penetrate.

The electronic board 50 of the device comprises audio/video connectors 30, for example of the 1394, Ethernet or telephone type. Its size is smaller than that of the package so as to enable air to flow around. Attachment means, not shown in the figure, are designed to hold this electronic board in position in the package.

This electronic board also has components, not shown in the figure, among which there is an interface module responsible for managing the transmission of the data on the network.

This interface module determines the source of the data flow according to the connection means and constructs a header indicating the destination of the data packets. This interface module is responsible for multiplexing the data coming from different connections 30 and transmitting them to the data-transport cable shown here under the reference 40a.

Conversely, the interface module which receives data packets from the data-transport cable 40a coming from the central unit 100 will demultiplex this data in order to direct it towards the output ports or corresponding connection means 30. This module may also comprise a digital/analog converter responsible for converting the digital data into analog data designed for example to be displayed on an analog television set.

Thus, the multimedia connection interface must perform several functions such as multiplexing, demultiplexing or digital/analog conversion. These functions necessitate the contribution of electronic components that will consume power and therefore release heat. A heat dissipation system as described in FIG. 1 is then well suited to this type of network.

The cold air B1 will flow around the components of the board 50 in order to cool them, and the hot air that comes out of D will be drawn by the duct 60a connected to the package 530 of the connection interface 10a.

Figure 6:
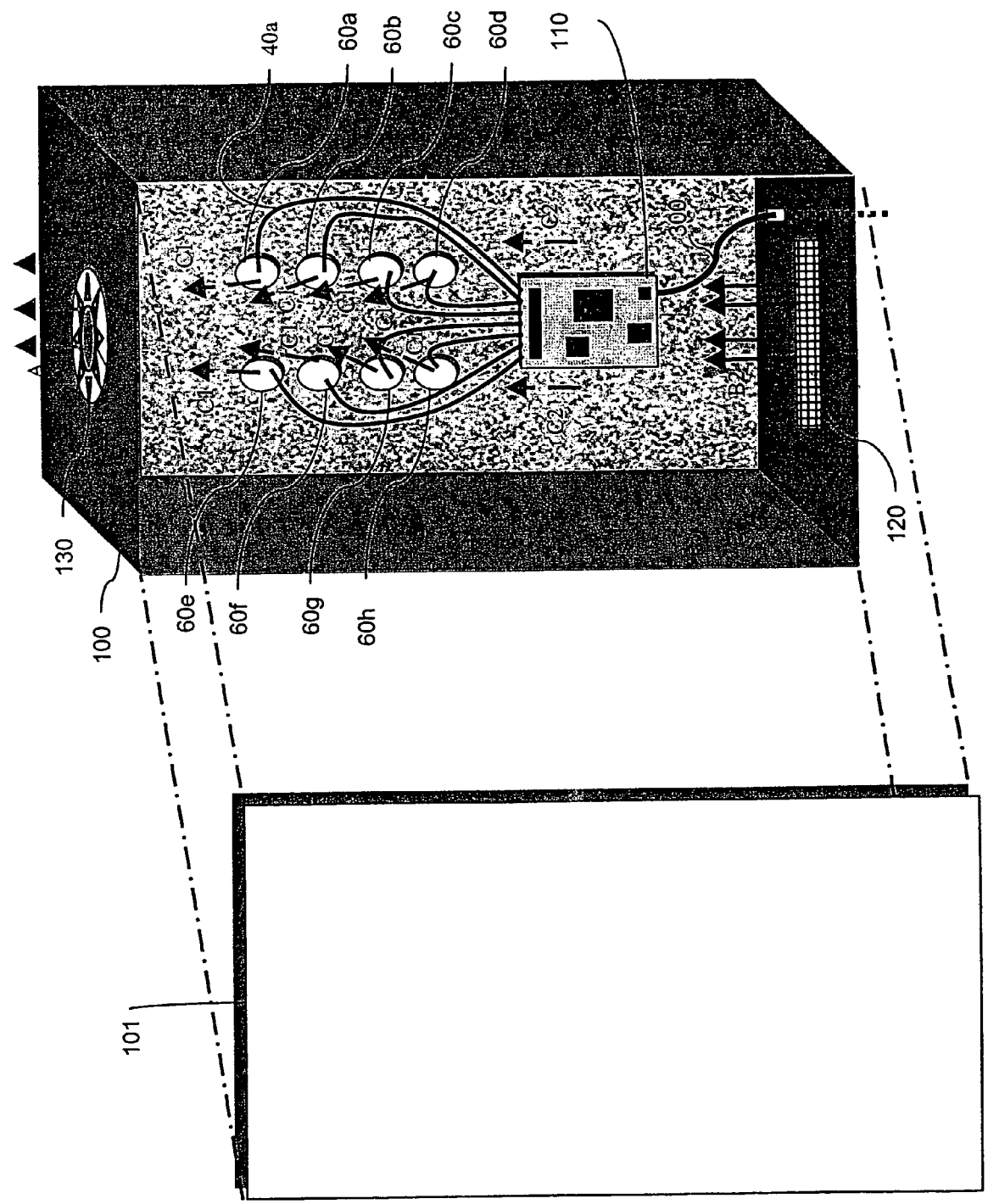
FIG. 6 shows the central unit installed in a communications network implementing the heat dissipation system according to the invention.

FIG. 6 is an exploded view of a central unit of a communications network interconnection type as described with reference to FIG. 4. This interconnection unit comprises a ventilation unit as described in FIG. 3. It thus comprises a fan 130 on its upper face, connections to the different ducts 60a, 60b, 60c, 60d, 60e, 60f, 60g and 60h, and an air inlet 120 on its lower face. It also has an electronic board 110 powered via the power supply cable 300. On this electronic board 110, there is an interconnection module responsible for routing digital type data packets in the communications network, according to the path information that they contain. This module enables centralized management of data in the communications network. The electronic board also comprises a controller capable of controlling the starting up and the speed of the fan 130.

Thus the hot air coming from the ducts rises as represented by the arrows C1 towards the fan 130 which discharges it out of the unit in the manner indicated by the arrows A.

Apart from the fact of cooling the components of the different connection interfaces of the communications network, the ventilation unit provided in the central unit will also cool the components of the board 110 as explained with reference to FIG. 3. Thus, the cool air B2 enters through the air inlet 120 and cools the components of the board 110. The hot air that results therefrom, represented by the arrows C2, is discharged by the fan 130.

By way of a non-restrictive example, in the case of a central unit as illustrated in FIG. 6, this unit has the capacity to dissipate heat in eight electronic devices of the network.

The board 50 of an electronic device as described in FIG. 5 dissipates power of about 50 watts.

The central unit must therefore dissipate the equivalent of about 80 watts of power.

The power dissipated by the board 110 integrated into the central unit is about 70 watts. This gives, in all, 150 watts to be dissipated for the central unit.

The following formula is used to compute the necessary ventilation flow rate V of the fan 130:

$$V=3.5*P/(Ti-Ta)$$

where
- Ta is the maximum ambient temperature in the machinery room or garage in which the central unit is located. This temperature can be estimated at 40° C.
- Ti is the maximum internal temperature allowable within the central package 100. This temperature can be estimated at 55° C.
- P is the power to be dissipated. This power is equal to 150 watts as was seen further above.
- We thus obtain a result of V=31 m$^3$/h.

Furthermore, the load loss in the ducts 60a, b, c, d, e, f, g and h can be estimated at about 80 Pa for a length of 20 m. It is therefore necessary to ensure depression of about 80 Pa in the package 100.

These characteristics of 31 m$^3$/h with a depression of 10 Pa are those encountered classically for variable speed fans used in computer equipment designed for large-scale consumer uses.

In a particular embodiment of the invention, the rotation speed of the fan can be controlled following information coming from the connection interfaces. Indeed, these connection interfaces may comprise a temperature sensor measuring the temperature of the board 50. The temperature information is transmitted to the controller of the board 110. Thus, if the multimedia interface is connected to fully active multimedia devices, the components are put to work and release heat whereas, if the devices are on standby, the components release no heat and the ventilation system can then be reduced.

The controller of the board 110 receiving the temperature information from the electronic devices could then match the speed of the fan to the requirements of the network.

Naturally, the present invention is in no way restricted to the embodiments described and shown. On the contrary, it encompasses every variant within the scope of those skilled in the art.

What is claimed is:

1. A system for the dissipation of heat in at least one electronic device in a home network, comprising:
    at least one electronic device embedded in a wall of a home;
    a central unit having an air circulation means; and
    at least one link connecting the central unit and each electronic device, wherein each link is installed in the home for protection of cables passing through an infrastructure of the home and the link comprises electronic means for circulating data to the electronic device; and
    wherein the dissipation of heat in the electronic device is obtained by the circulation of air throughout the link, from the electronic device to the central unit by the circulation means.

2. A heat dissipation system according to claim 1, wherein a link comprises a hollow duct in which there passes at least one data-transport cable.

3. A heat dissipation system according to claim 2, wherein said hollow duct has a diameter of less than 30 mm.

4. A heat dissipation system according to claim 1, wherein the circulation means of the central unit comprises a fan adapted to the creation of an air depression inside the central unit.

5. A heat dissipation system according to claim 4, wherein the depression inside the central unit is such that the pressure inside it is lower than the pressure inside a room in which the electronic device is located.

6. A heat dissipation system according to claim 1, wherein the electronic device is closed and comprises an air inlet.

7. A heat dissipation system according to claim 1, wherein the central unit is closed and comprises an air inlet.

8. A heat dissipation system according to claim 1, wherein the central unit is located in a room of the home network different from that in which the electronic devices are located.

9. A heat dissipation system according to claim 1, wherein the electronic devices are connection interfaces adapted to the connection of different multimedia devices.

10. A heat dissipation system according to claim 9, wherein the central unit comprises an interconnection module adapted to manage data exchanges between the connection interfaces.

11. A heat dissipation system according to claim 1, wherein the electronic devices comprise at least one temperature sensor.

12. A heat dissipation system according to claim 11, wherein the dissipation of the heat in the electronic devices is controlled as a function of the information on temperature coming from said temperature sensor or sensors.

13. A heat dissipation apparatus for dissipating the heat of at least one electronic device in a home network, the electronic device being embedded in a wall of a home, comprising:
    ventilation and air discharge means for creating an air depression in the apparatus and discharging air coming into the apparatus; and
    at least one link connecting the ventilation and air discharge means with each electronic device, the link being installed in the home for protection of cables passing through an infrastructure of the home and comprising electronic means for circulating data to the electronic device,
    wherein the dissipation of heat in the electronic device is obtained by the circulation of air throughout the link caused by the ventilation and air discharge means.

14. An apparatus according to claim 13, wherein the depression inside the apparatus is such that the pressure inside it is lower than the pressure inside a room in which the electronic device is located.

15. An apparatus according to claim 13, wherein the apparatus is closed and comprises an air inlet.

16. An apparatus according to claim 13, comprising an interconnection module that manages exchanges of data through the home network.

17. An apparatus according to claim 13, comprising means to control the speed of the ventilation means as a function of information on temperature coming from the electronic devices.

* * * * *